(12) United States Patent
Pätz et al.

(10) Patent No.: US 6,474,729 B2
(45) Date of Patent: Nov. 5, 2002

(54) SOLAR COVER

(75) Inventors: Werner Pätz, Hofstetten (DE); Helmut Teschner, Finning (DE)

(73) Assignee: Webasto Vehicle Systems International GmbH, Stockdorf (DE)

(*) Notice: Subject to any disclaimer, the term of this patent is extended or adjusted under 35 U.S.C. 154(b) by 0 days.

(21) Appl. No.: 09/855,033

(22) Filed: May 15, 2001

(65) Prior Publication Data
US 2002/0008412 A1 Jan. 24, 2002

(30) Foreign Application Priority Data
May 15, 2000 (DE) .......................... 100 23 546

(51) Int. Cl.[7] .............................. B60J 7/043
(52) U.S. Cl. ..................................... 296/211
(58) Field of Search ............... 296/216.06, 216.09, 296/211

(56) References Cited
U.S. PATENT DOCUMENTS
6,155,635 A   12/2000   Wecker

FOREIGN PATENT DOCUMENTS

| DE | 38 35 560 A1 | 4/1990 | |
|----|--------------|--------|-|
| DE | 197 16 389 C1 | 9/1998 | |
| JP | 32521 | * 2/1984 | ............ 296/211 |
| JP | 3231027 | * 10/1991 | ............ 296/211 |

* cited by examiner

Primary Examiner—Dennis H. Pedder
(74) Attorney, Agent, or Firm—Nixon Peabody LLP; David S. Safran

(57) ABSTRACT

In a solar cover for a motor vehicle roof (2) with a carrier plate (10), a plurality of solar cells (18) located on the carrier plate, and a cover layer (36) which covers the side of the solar cells facing away from the carrier plate, there is a plastic injection molded part that service as the carrier plate (10) and in which contours (12, 16) are molded for positioning of the solar cells (18). The contours prevent the solar cells from becoming off-center during installation of the solar cover.

16 Claims, 2 Drawing Sheets

SOLAR COVER

BACKGROUND OF THE INVENTION

1. Field of the Invention

This invention relates to a solar cover for a motor vehicle roof with a carrier plate, a plurality of solar cells located on the carrier plate, and a cover which covers the side of the solar cells facing away from the carrier plate.

2. Description of Related Art

A solar cover of the above-mentioned type is known from published German Patent Application DE 198 13 324 A1 and corresponding U.S. Pat. No. 6,155,635, which describe a frameless solar cover in which between an essentially flat outside cover plate and an inside cover there is plurality of solar cells. In the installation of the solar cover, a soft embedding material is applied to the cover plate and the solar cells are inserted into it, the embedded solar cells finally being covered by a cover, for example, a film or a thin plate. Production of this solar cover is problematical in that the solar cells must be positioned very precisely on the cover plate before lamination or sealing; this is rather difficult on the flat cover plate.

Furthermore, published German Patent Application DE 38 35 560 A1 describes a plastic roof for motor vehicles which has a profile frame which is made to accommodate the outside roof shell and the inside roof lining, with reinforcements in the form of a lattice or honeycomb structure. According to one preferred embodiment, in the honeycomb, there can also be stiffening surfaces on which the solar cells can be located. The roof described in published German Patent Application DE 38 35 560 A1 is disadvantageous in several respects. On the one hand, the cross section in the proposed structure is rather tall and is therefore not suitable for movable cover elements. On the other hand, as a result of the lattice element, transparent or partially transparent roof elements cannot be made since the lattice element must be covered with an opaque cover. In addition, it is extremely difficult to wire the solar cells which are located in the cells of the lattice structure since the solar cells must make contact with the openings provided in the stiffening surfaces from underneath; however, the respective contacts then emerge in the honeycomb structure which hinders the connection of the individual contacts.

German Patent DE 197 16 389 A1 discloses a plastic cover which has a trough-shaped receiver for the solar cell assembly on its bottom. On the side edges, there are projections which, on the one hand, facilitate the positioning of the solar cells, and on the other, are used as a support for a glass plate as a cover on the inside.

SUMMARY OF THE INVENTION

Thus, a primary object of this invention is to devise a solar cover of the initially mentioned type which can be produced and installed more easily.

In accordance with the invention, this object is achieved by a plastic injection molding being used as the carrier plate in which contours are molded for positioning of the solar cells. Because the solar cover for a motor vehicle roof is provided with a plastic injection molding as the carrier plate in which contours are molded for positioning of the solar cells, the positioning of the solar cells is greatly facilitated in installation. Preferably, the contours are chosen such that the position of each individual solar cell is stipulated. However, embodiments are advantageous relative to the prior art in which the contours determine the position of only individual rows or groups of solar cells, but not the position of each cell within the row or group, as was explained with reference to published German Patent Application DE 198 13 324 A1. The cover according to the invention has a simple structure comprised of few parts and can still be produced quickly and economically.

In particular, for purposes of forming the contour, the carrier plate can be provided with depressions and/or can have connectors, the size of the depressions or the distance of the connectors preferably corresponding to the size of the solar cells. In this way, definite and exact positioning of the solar cells is achieved which does not allow the solar cells to be off-center relative to one another during lamination or sealing. Thus, the installation cost and the time necessary for production of the solar cover can be greatly reduced, and at the same time, the fault rate or scrap rate is reduced since a critical source of faults, i.e., off-center solar cells, can be completely precluded.

In another embodiment of the invention, the contours can comprise positioning aids for positioning of the printed conductors used for making contact with the solar cells. These contours can be produced, for example, by there being openings in the connectors between the individual solar cells into which the printed conductors are inserted. In addition, the contours can also have means for locking of the solar cells and the printed conductors, for example, catch hooks, projections, projecting edges and the like.

Conventionally, the solar cells can be embedded in a hot melt adhesive film, for example consisting of ethylene vinyl acetate, or a sealing compound. To position the hot melt adhesive films it is advantageous if the carrier plate on its inside has fixing elements for the hot melt adhesive films. They can be made, for example, as domes on the four corners of the trough-shaped depression of the carrier plate.

Since both the carrier plate and also the outside pane should be made as a more stable element, to achieve an especially light cover which is composed of few parts, it is especially advantageous if the functions of the outside pane and those of the carrier plate are combined in one component. According to one especially preferred embodiment of the invention, therefore, the carrier plate is produced from transparent plastic and is used as the outside pane of the solar cover, with the solar cells attached to its underside. If a solar cover is to be built which is formed of as few parts as possible, and which can therefore be installed especially quickly and easily, the carrier plate can also be made such that it comprises further components as can be conventionally found in solar covers, especially a reinforcing frame, fastening elements for connection to the fixed motor vehicle roof, fastening elements for connection to the roof mechanism for moving the cover element, and the like. These components can be made in one piece during the production of the carrier element at the same time or can be cast onto the pre-cast carrier element.

If the line arrangements which are intended for connecting the solar cells to the motor vehicle electrical system are to be protected from viewing from the outside, in the edge area of the transparent carrier plate in which there are the indicated line arrangements, there can be a nontransparent material. Here, it can be a colored layer which is applied to the edge area before the line arrangements are attached, or there can be a component of opaque material which bears the line arrangements. In particular, the component of opaque material can be a plastic injection molded part which is injected onto the transparent carrier plate. The opaque material can be the same material as that of the transparent carrier plate, in this case the material being dyed in order to prevent it from being looked through.

To protect the top of the transparent cover plate against damage, especially against UV effects or scratching, it can be coated with a transparent protective varnish. Especially advantageous coatings can be polysiloxane varnishes, "Orcomers" or nanometer coatings.

One preferred embodiment of this invention is explained in detail below with reference to the accompanying drawings.

DETAILED DESCRIPTION OF THE INVENTION

Figure 1:
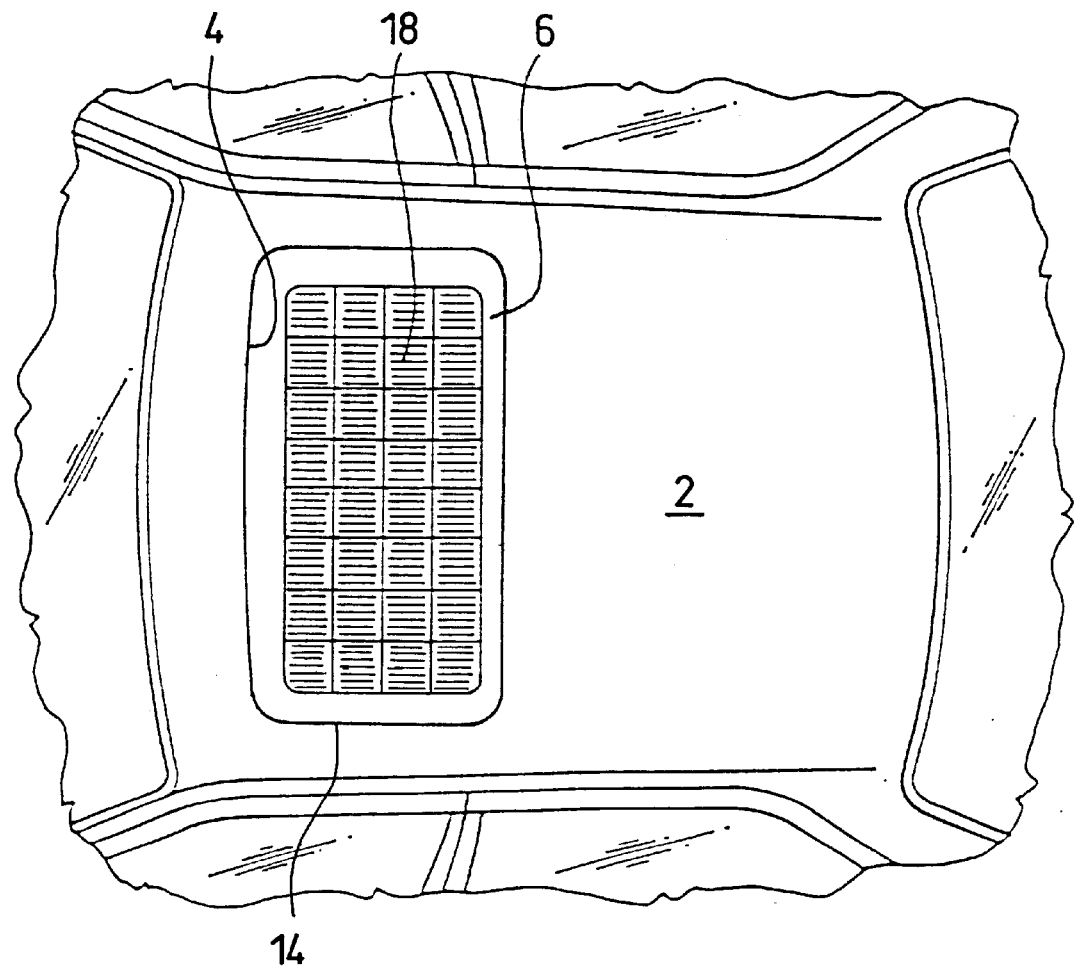
FIG. 1 shows a plan view of a solar cover.

According to FIG. 1, in the fixed roof surface 2 of a motor vehicle roof, there is a roof cutout 4 which can be selectively closed or at least partially opened by means of a solar cover 6. It goes without saying that the solar cover described here can be part of an openable motor vehicle roof, for example, a sliding roof, a sliding and lifting roof, or a spoiler roof, or a fixed cover. The solar cover 6 has solar cells 18 over part of its surface, as is explained with reference to FIG. 2.

Figure 2:
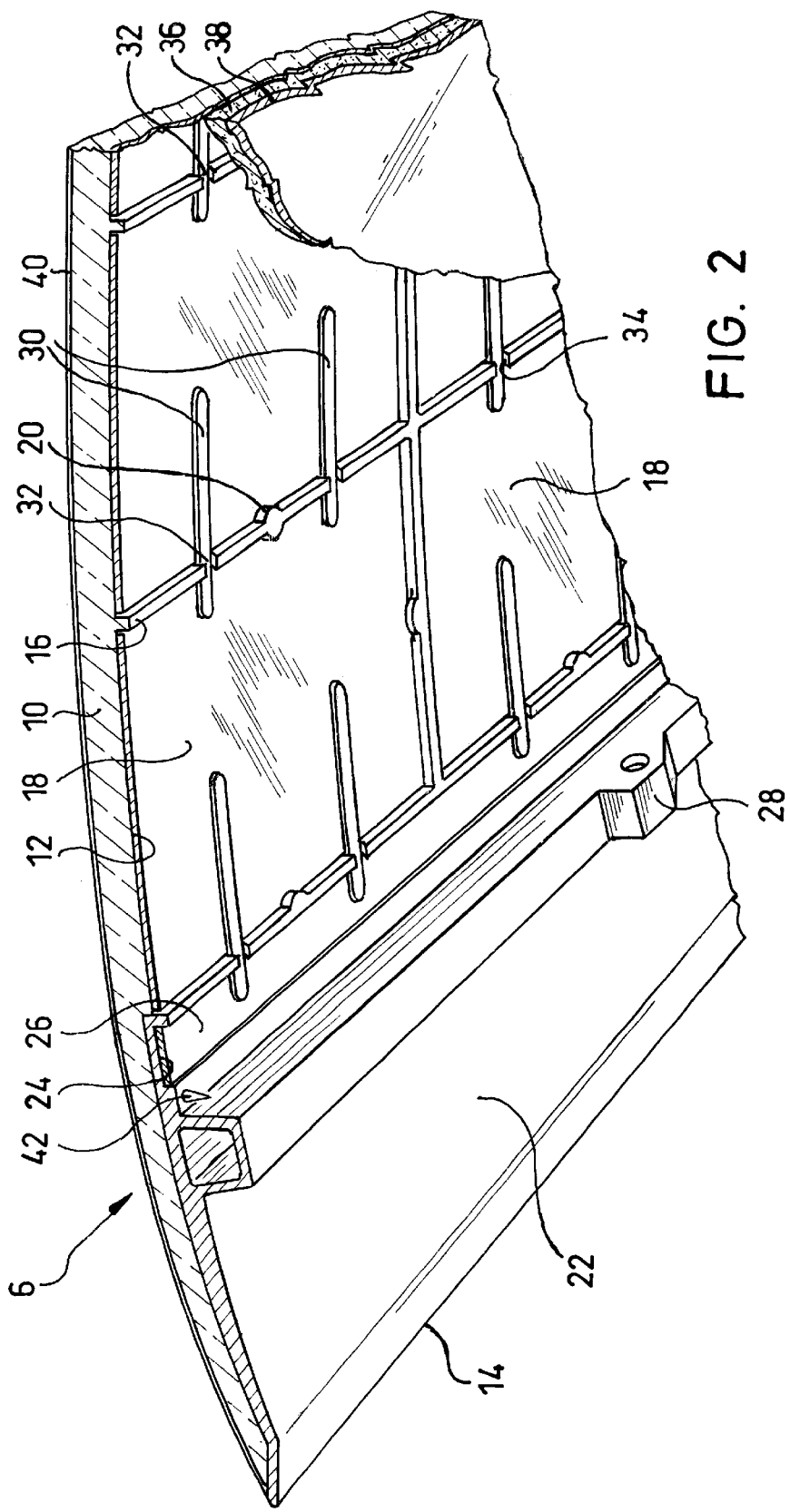
FIG. 2 shows a perspective partial view of the solar cover shown in FIG. 1, from underneath.

FIG. 2 shows a portion of the solar cover 6 in accordance with this invention in which a carrier plate 10, which is made of transparent plastic, is used as the outside pane of the solar cover. On its underside, the carrier plate 10 has depressions 12 which are separated from one another by connectors 16 which run lengthwise and transversely relative to the side edge 14 of the cover. The distance of the connectors 16 corresponds to the size of the solar cells 18 which are inserted into the depressions 12 when the solar cover is installed. The carrier plate 10 has catch elements 20 into which the solar cells 18 are clipped during installation and which prevent the solar cells 18 from falling out of the depressions 12. Contours for positioning of the solar cells 18 as well as contours for positioning the printed conductors 30 are provided both in the edge area of the carrier plate 10 and also in the intermediate spaces.

Along the side edge 14 of the cover, a frame part 22 is applied to the carrier plate 10 and is used, on the one hand, for reinforcing the cover element, and on the other hand, has channels 24 in which there are line arrangements 26 for connecting the solar cells 18 to the motor vehicle electrical system. To prevent the line arrangements or ground continuity conductors 26 from being viewed from the outside (i.e., from overhead), the frame component 22 is made of an opaque material or from the same material as the carrier plate which, however, has been dyed.

Furthermore, the frame component 22 as shown can have fastening elements 28 for connecting the solar cover to the fixed motor vehicle roof when the cover element is a fixed cover, or to a roof mechanism when the cover element is the cover of a sliding roof, a sliding and lifting roof or a spoiler roof.

To prevent the contacts 30 which are designed to make contact with the solar cells 18 from becoming off-center, in the connectors 16, there are openings 32 into which the contacts 30 are inserted when the solar cover is installed. To prevent the inserted contacts 30 from falling out, the openings 32 have projecting edges 34 into which the contacts 30 are clipped.

After the solar cells 18 and the pertinent contacts 30 and line arrangements 26 are inserted, they are permanently fixed by sealing or cementing-over with a hot melt adhesive film 36. For positioning of the hot melt adhesive films 36 which can be located both above and under the solar cells 18, at least in the corner areas, there are fixing elements in the form of spikes 42. The hot melt adhesive films 36 can be slipped onto them. The hot melt adhesive films 36 are thus likewise definitively held in their position if a connection to the solar cells 18 and the carrier plate 10 has been made by thermal action. Then, over the sealing compound or the hot melt adhesive film 36, there is still another film 38 or a cover plate which covers the embedded cell assembly towards the vehicle interior and protects it against damage. If desired, this film or cover plate can be dyed to reduce light incidence through the solar cover. The top of the transparent carrier plate is advantageously provided with a protective varnish 40 which protects the carrier plate against UV influences or scratching.

It goes without saying that the solar cover shown in FIG. 2 represents only one preferred embodiment. As already mentioned, the arrangement can also be made such that the carrier plate which is provided with positioning aids lies underneath in the solar cover and over the top of the carrier plate on which the solar cells and the pertinent electrical connections and terminals are located, there is an outside pane.

What is claimed is:

1. A solar cover for a motor vehicle roof, comprising:
    a carrier plate;
    a plurality of solar cells located on the carrier plate; and
    a cover layer which covers a side of the solar cells facing away from the carrier plate;
    wherein the carrier plate is a plastic, injection molded part in which contours have been molded for positioning of the solar cells; and wherein the contours comprise positioning aids for positioning of printed conductors used for making electrical contact with the solar cells.

2. Solar cover as claimed in claim 1, wherein the contours are formed by depressions in the carrier plate.

3. Solar cover as claimed in claim 2, wherein the size of the depressions corresponds to the size of the solar cells.

4. Solar cover as claimed in claim 1, wherein the carrier plate has connectors for forming the contours.

5. Solar cover as claimed in claim 4, wherein the connectors are spaced at distances which corresponds to the size of the solar cells.

6. Solar cover as claimed in claim 1, wherein the contours have means for locking in the printed conductors.

7. A solar cover for a motor vehicle roof, comprising:
    a carrier plate;
    a plurality of solar cells located on the carrier plate; and
    a cover layer which covers a side of the solar cells facing away from the carrier plate;
    wherein the carrier plate is a plastic, injection molded part in which contours have been molded for positioning of the solar cells; and wherein the contours have means for locking in the solar cells.

8. Solar cover as claimed in claim 1, wherein the solar cells are embedded into one of a hot melt adhesive film and a sealing mass.

9. solar cover as claimed in claim 1, wherein the carrier plate is formed of transparent plastic and is an outside pane of the solar cover, the solar cells being attached to an underside of the carrier plate.

10. Solar cover as claimed in claim 9, wherein in an edge area of the transparent carrier plate in which there are electrical line arrangements for connecting the solar cells to a vehicle electrical system, there is an opaque material which conceals the line arrangements from viewing from the outside.

11. Solar cover as claimed in claim 10, wherein the opaque material is a colored layer which has been applied to the edge area before attachment of the line arrangements.

12. Solar cover as claimed in claim 10, wherein a component of an opaque material which bears the line arrangements is provided in the edge area.

13. Solar cover as claimed in claim 12, wherein the component of opaque material is a plastic injection molded part which has been injected onto the transparent carrier plate.

14. Solar cover as claimed in claim 9, wherein the cover layer is a film.

15. Solar cover as claimed in claim 9, wherein a top side of the transparent cover plate has coating of a transparent protective varnish.

16. A solar cover for a motor vehicle roof, comprising:
   a carrier plate;
   a plurality of solar cells located on the carrier plate; and
   a cover layer which covers a side of the solar cells facing away from the carrier plate;
wherein the carrier plate is a plastic, injection molded part in which contours have been molded for positioning of the solar cells; and wherein fixing elements for attachment of at least one hot melt adhesive film are provided on the carrier plate.

* * * * *